United States Patent [19]
Filipiak

[11] Patent Number: 5,188,979
[45] Date of Patent: Feb. 23, 1993

[54] METHOD FOR FORMING A NITRIDE LAYER USING PREHEATED AMMONIA

[75] Inventor: Stanley M. Filipiak, Pflugerville, Tex.

[73] Assignee: Motorola Inc., Schaumburg, Ill.

[21] Appl. No.: 749,820

[22] Filed: Aug. 26, 1991

[51] Int. Cl.⁵ .......................................... H01L 21/44
[52] U.S. Cl. ................... 437/192; 437/225; 437/190; 437/245
[58] Field of Search ............ 437/225, 192, 190, 245, 437/247

[56] References Cited

U.S. PATENT DOCUMENTS

| | | | |
|---|---|---|---|
| 4,535,000 | 8/1985 | Gordon | 427/160 |
| 4,784,973 | 11/1988 | Stevens et al. | 437/192 |
| 4,920,071 | 4/1990 | Thomas | 437/190 |
| 5,002,646 | 3/1991 | Egerton et al. | 204/177 |
| 5,021,134 | 6/1991 | Blackburn et al. | 204/177 |
| 5,043,300 | 8/1991 | Nulman | 437/192 |

Primary Examiner—Brian E. Hearn
Assistant Examiner—Trung Dang
Attorney, Agent, or Firm—Patricia S. Goddard

[57] ABSTRACT

A process for forming a titanium nitride barrier layer in semiconductor devices using preheated ammonia reduces susceptibility to junction spiking. In one form of the invention, a substrate having an overlying layer of titanium is heated to a predetermined temperature in a reaction chamber. An ammonia gas is preheated to temperature not less than 600° C. and is introduced into the reaction chamber. The preheated ammonia gas and the titanium layer react to form a quality titanium nitride (TiN) layer which is highly resistant to the junction spiking phenomenon. Nitride layers of other Group IVB or Group VB elements of the periodic table may also be formed using the present invention.

9 Claims, 2 Drawing Sheets

METHOD FOR FORMING A NITRIDE LAYER USING PREHEATED AMMONIA

FIELD OF THE INVENTION

The present invention relates to a method for forming a nitride layer, and more specifically to a method for forming, for example, a titanium nitride barrier layer in a semiconductor device using preheated ammonia.

BACKGROUND OF THE INVENTION

Titanium nitride (TiN) films have several applications, including use as a barrier layer or a local interconnect in semiconductor devices. As an example, a titanium nitride film in a semiconductor device is often formed between a layer of aluminum or an aluminum alloy and a silicon substrate to prevent a problem known as "spiking." Spiking occurs in a semiconductor device at elevated temperatures (e.g. in excess of 400° C.) in portions of the device where aluminum is in contact with silicon or has the ability to come in contact with silicon by diffusion through other layers. The solubility of silicon in aluminum at elevated temperatures is quite high, such that aluminum will take silicon into solution. As a result of the aluminum "consuming" the silicon, voids or pits can be formed in the silicon substrate. These pits are very regularly shaped and often look like upside-down pyramids formed in the silicon substrate because the silicon substrate is usually monocrystalline silicon and therefore has a specific crystallographic orientation. If pitting happens to occur in portions of the silicon substrate in which junctions have been formed, electrical characteristics of the junctions are significantly and undesirably altered, often leading to junction leakage. Because spiking can result in junction leakage, the phenomenon is also known as "junction spiking." By providing a barrier layer between the silicon substrate and aluminum, the problem of spiking can be reduced. The presence of a barrier layer serves to block the diffusion of silicon and aluminum such that the two materials have a reduced chance of meeting and going into solution.

Titanium nitride is one of a few materials which is commonly used as a barrier layer in semiconductor devices. A widely practiced approach to forming a TiN barrier between silicon and aluminum is to first deposit a layer of titanium onto a silicon substrate. The silicon substrate with the titanium layer is then annealed by placing the substrate in a reaction chamber and heating the substrate to, for example, a temperature near 600° C. or higher. An ammonia gas ($NH_3$) at room temperature is pumped into the reaction chamber and reacts with the layer of titanium to form a thin layer of titanium nitride (TiN) on the surface of the titanium layer. The reaction occurs in accordance with the equation $2Ti + 4NH_3 \rightleftharpoons 2TiN + N_2 + 6H_2$. The thickness of the resulting TiN layer is determined by the amount of time the titanium layer is exposed to the ammonia, as well as the temperature of the substrate and other processing variables. Many semiconductor manufacturers employ a rapid thermal anneal (RTA), on the order of ten seconds to two minutes, to form a TiN barrier layer. A typical TiN barrier layer thickness formed by the above mentioned RTA process may be on the order of 50 to 400 Å (5-40 nm).

However, even with a barrier layer, spiking can occur upon exposure of a semiconductor device to elevated temperatures, especially if the exposure is for an extended period of time. Silicon and aluminum atoms become more mobile as temperature increases, allowing silicon to diffuse into an overlying titanium layer. At the same time, aluminum diffuses through a thin TiN barrier layer formed on the titanium layer and subsequently into the titanium layer. Eventually, the aluminum and silicon diffuse to the extent that aluminum atoms and silicon atoms are in close enough proximity to form a solution. As a result, silicon is consumed by aluminum, leaving voids or pits. Therefore, the use of barrier layers does not completely prevent junction spiking at elevated temperatures. Instead, the presence of a barrier layer more or less serves to delay the problem. In using barrier layers in semiconductor devices, manufacturers hope to delay spiking sufficiently to avoid the formation of pits at temperatures which a semiconductor device might experience. However, existing barrier layers and processes for forming these barrier layers are often inadequate in substantially preventing silicon consumption by aluminum.

SUMMARY OF THE INVENTION

The foregoing problem of nitride layers being susceptible to spiking is significantly overcome with the present invention. In one form of the invention, a nitride layer is formed by providing a substrate having an overlying layer of material selected from the group consisting of titanium, hafnium, zirconium, vanadium, niobium, and tantalum. The substrate is placed in a reaction chamber and is heated to a predetermined temperature. An ammonia gas is preheated to a temperature greater than 600° C. and is introduced into the reaction chamber. The ammonia gas and the layer of material react to form either a titanium nitride, a hafnium nitride, a zirconium nitride, a vanadium nitride, a niobium nitride, or a tantalum nitride layer.

These and other features, and advantages, will be more clearly understood from the following detailed description taken in conjunction with the accompanying photomicrographs.

BRIEF DESCRIPTION OF THE DRAWINGS

| | |
|---|---|
| substrate temperature = | 650° C. |
| anneal time = | 15 seconds |
| reaction gas = | ammonia ($NH_3$) |
| gas flow = | 3 liters/minute |
| gas temperature = | 20° C. (FIG. 1) |
| | 610° C. (FIG. 2) |
| | 750° C. (FIG. 3) |
| | 770° C. (FIG. 4) |

Figure 1:
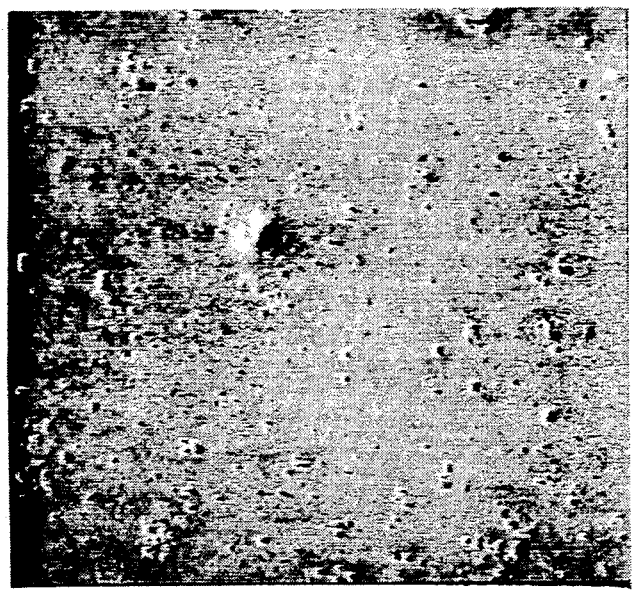
FIGS. 1-4 are photomicrographs of a bare silicon substrate. A layer of titanium was deposited on the substrate and was annealed in an ammonia gas to form a titanium nitride (TiN) barrier layer. Anneal conditions for each of the photomicrographs are given below.

A 6000 Å (600 nm) layer of aluminum was deposited on each substrate. The silicon substrates were then subjected to a 30 minute anneal at 515° C. in an $N_2$ ambient in order to initialize the spiking phenomenon described earlier, thereby causing pits to form in each of the substrates as evidenced in the photomicrographs. The aluminum, TiN, and titanium were stripped from the substrates using an HF etch, leaving the bare silicon substrates shown in FIGS. 1-4.

DETAILED DESCRIPTION OF A PREFERRED EMBODIMENT

As discussed earlier, barrier layers used between an aluminum layer and a silicon substrate do not eliminate spiking, but instead delay the problem such that damage done to a silicon substrate is lessened. Under certain conditions, many existing barrier layers do not adequately reduce spiking. For example in semiconductor devices, existing titanium nitride barrier layers often fail when a device is exposed to elevated temperatures during processing, and in particular during assembly or packaging operations. The present invention provides a method of forming an improved nitride layer which is suitable for use in semiconductor devices to significantly reduce the extent of spiking. By forming, for example, a titanium nitride layer using a preheated ammonia gas, integrity and strength of the TiN layer is improved over other TiN layers commonly used in the semiconductor industry. It is important to note that while the remaining discussion will be directed to use of the present invention in connection with the fabrication of titanium nitride layers in a semiconductor device, the present invention is applicable to any use of nitride films.

In accordance with one embodiment of the present invention, a titanium nitride layer is formed by first depositing a titanium layer over a substrate, for example a silicon wafer. The titanium layer may be deposited using known deposition techniques, including chemical vapor deposition (CVD), sputter deposition, or the like. The silicon wafer with the overlying titanium layer is then positioned in a reaction chamber having the capability of heating the substrate to, for example, a temperature greater than 600° C. One known method for heating the substrate in the reaction chamber to the desired temperature range is through the use of arc lamps which are regulated by a thermocouple.

Once the substrate is heated, a preheated ammonia gas ($NH_3$) is introduced into the reaction chamber. In accordance with the invention, the ammonia gas is heated to a temperature greater than 600° C., but preferably to a temperature greater than 700° C. The ammonia gas may be heated in a number of ways, for example by routing the gas through a tube furnace prior to the gas entering the reaction chamber. Depending on the size of the furnace and the flow rate of the gas, the gas may need to be directed within the furnace using baffles, glass beads, or the like, in order to keep the gas in the furnace long enough to reach the desired temperature. Any device used to direct gas flow, and the furnace itself, should be made of materials which will not react with or otherwise contaminate the ammonia gas.

The preheated ammonia gas is then introduced into the reaction chamber which contains the heated substrate with the overlying titanium layer. The ammonia gas reacts with the titanium to form a layer of titanium nitride (TiN) on a top surface of the titanium layer according to the equation $2Ti + 4NH_3 \rightleftharpoons 2TiN + N_2 + 6H_2$. The reaction is sustained for a period of time from 10 seconds to 2 minutes. Other gases may also be introduced into the reaction chamber. For example, nitrogen or another inert gas may be used to clean or purge the chamber before and/or after the reaction takes place. Once the reaction is complete, the substrate is removed from the reaction chamber and undergoes any remaining fabrication steps necessary to complete the semiconductor device.

WORKING EXAMPLE

Four groups of silicon wafers (groups A, B, C, and D) were deposited with a sputtered titanium film having a nominal thickness of 1000 Å (100 nm). Each wafer was individually placed in a quartz RTA (rapid thermal anneal) chamber and heated to a temperature of 650° C. using 1200 Watt lamps. The wafer temperature was measured using a K-type thermocouple in contact with the wafer surface.

Room temperature ammonia gas was flowed through a stainless steel tube furnace at a rate of 3 liters/minute. The tube furnace was 2 inches (5.1 cm) in diameter and 2 feet (61 cm) in length. In place of baffles, stainless steel nuts and bolts were placed within a 1 foot (30.5 cm) central portion of the furnace to divert the ammonia gas within the furnace and allow the gas to reach a high temperature. The furnace temperature was varied for each group of wafers. In processing wafers from group A, the furnace used to heat the ammonia gas was held at room temperature (approximately 20° C.). In processing wafers from group B, the furnace was held at approximately 800° C. Wafers from groups C and D were processed with a furnace temperature of approximately 1000° C. and 1100° C., respectively. Ammonia gas temperatures as the gas exited the furnace were also recorded. The temperatures are given below:

| Furnace Temp. | Gas Temp. |
| --- | --- |
| 20° C. | 20° C. |
| 800° C. | 610° C. |
| 1000° C. | 750° C. |
| 1100° C. | 770° C. |

After being heated, the ammonia gas was introduced into the reaction chamber at a flow rate of 3 liters/minute. The reaction chamber was held at or near atmospheric pressure (760 mtorr). The reaction between the heated ammonia gas and the titanium layer on the heated substrate was sustained for 15 seconds, to form a titanium nitride layer. Each substrate was then removed from the reaction chamber and a 6000 Å (600 nm) layer of aluminum was deposited onto the substrate using a conventional sputter deposition technique. Each wafer was then subjected to a high temperature anneal (approximately 515° C.) in a nitrogen ($N_2$) ambient for 30 minutes in order to induce aluminum spiking and the formation of pits in the silicon substrates. The results are shown in the photomicrographs of FIGS. 1–4.

Figure 2:
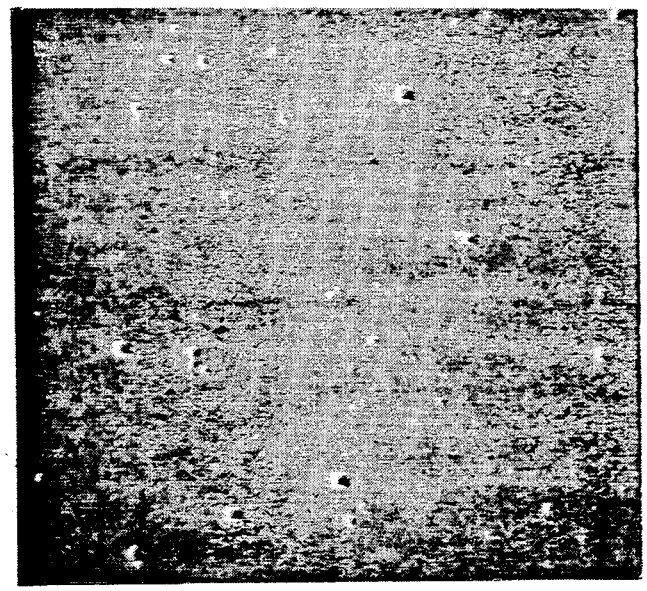
Figure 3:
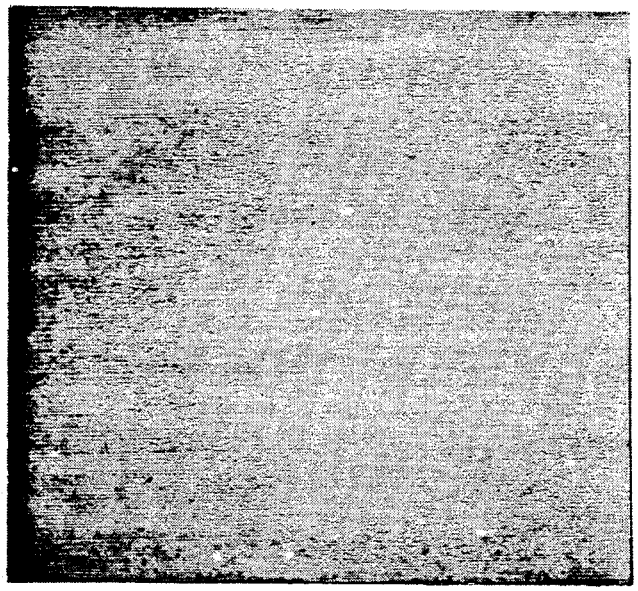
Figure 4:
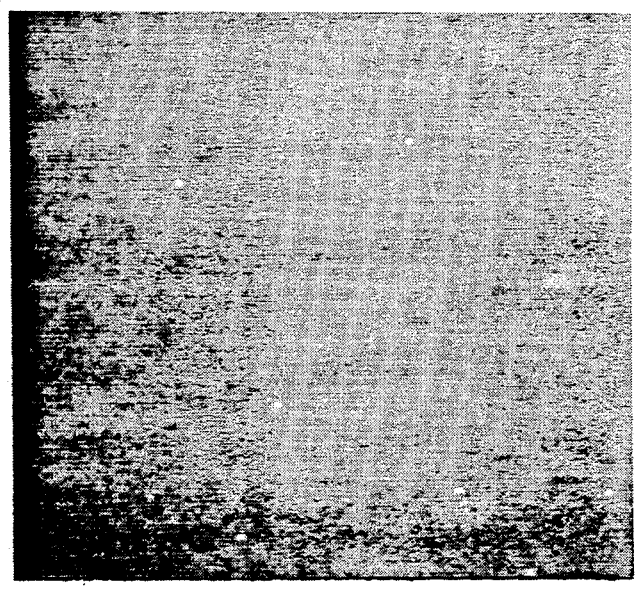

FIG. 1 is a photomicrograph taken at a magnification of 500× of a representative defect region of a wafer from group A. FIG. 2 is a photomicrograph at the same magnification and of the same region of a wafer from group B, while FIG. 3 and FIG. 4 correspond to wafers from group C and D, respectively. As is evidenced by the photomicrographs, the extent of silicon pitting is significantly reduced as the temperature of the preheated ammonia gas increases. The defect density of a wafer from groups A and B was roughly approximated at 4,400 defects/$cm^2$ and 420 defects/$cm^2$, respectively. A wafer from group C and a wafer from group D both had defect densities on the order of 80 defects/$cm^2$. Auger analysis performed on wafers which underwent similar processing conditions as described above indicates that the thickness of the titanium nitride actually decreases as the temperature of ammonia gas increases. Sheet resistance measurements confirm the fact that the titanium nitride layer thickness decreases with increasing ammonia gas temperature. However, it is apparent from the photomicrographs shown in FIGS. 1–4 that a decrease in TiN thickness as a result of using a preheated ammonia gas has no negative impact on the film's effectiveness in minimizing spiking. In actuality, the effectiveness of the TiN barriers significantly improves as the ammonia gas temperature increases, even though the TiN thickness is reduced. Existing processes for forming TiN films which do not use preheated ammonia, on the other hand, demonstrate a degradation in the effectiveness of the TiN barrier as the film thickness decreases.

The foregoing description and photomicrographs contained herein demonstrate many of the advantages associated with the present invention. In particular, it has been taught that use of a preheated ammonia gas establishes a significant improvement in the ability of a titanium nitride film to prevent spiking in comparison to use of a room temperature ammonia gas. Moreover, it appears that the higher the temperature of the ammonia gas, the better the resulting titanium nitride layer in preventing spiking. Another advantage is that the present invention may be practiced easily with existing equipment available to semiconductor manufacturers. Furthermore, the present invention adds negligible, if any, cost and time to the fabrication of semiconductor devices. It is also important to realize that due to the similarities in chemical and physical properties of Group IVB and Group VB elements of the periodic table, the present invention may also be practiced in forming hafnium, zirconium, vanadium, niobium, and tantalum nitride films.

Thus it is apparent that there has been provided, in accordance with the invention, a method for forming a nitride film using preheated ammonia that fully meets the advantages set forth previously. Although the invention has been described with reference to specific embodiments thereof, it is not intended that the invention be limited to these embodiments. Those skilled in the art will recognize that modifications and variations can be made without departing from the spirit of the invention. For example, the present invention is not limited to forming titanium nitride, but may also be used to form nitrides of any Group IVB or Group VB element in the periodic table, including hafnium, zirconium, vanadium, niobium, and tantalum. Furthermore, in forming a titanium nitride layer, the use of the TiN layer is not limited to use in a semiconductor device between silicon and aluminum layers. Any application which utilizes titanium nitride films (other Group IVB or Group VB nitride) can benefit from the present invention. In addition, the invention is not limited to any specific temperature of ammonia gas, but may be practiced by heating the gas to any temperature not less than 600° C. It is also important to note that the gas temperature as the gas enters the reaction chamber may be lower than the temperature to which the gas was heated. Furthermore, the invention is not limited to any particular reaction time, although a rapid thermal anneal (on the order of less than 2 minutes) is preferred. It is also important to note that the present invention is not limited in any way to deposition techniques used to form a titanium, hafnium, zirconium, vanadium, niobium, or tantalum layer on a substrate. Therefore, it is intended that this invention encompass all such variations and modifications as fall within the scope of the appended claims.

I claim:

1. A method for fabricating a semiconductor device having a titanium nitride barrier layer using preheated ammonia, comprising the steps of:
   providing a substrate;
   depositing a layer of titanium on the substrate;
   placing the substrate in a reaction chamber;
   heating the substrate in the reaction chamber to a specified temperature;
   introducing an ammonia gas which is preheated to a temperature not less than 600° C. into the reaction chamber; and
   reacting the preheated ammonia gas with the layer of titanium on the heated substrate to form a titanium nitride barrier layer.

2. The method of claim 1 wherein the step of introducing an ammonia gas comprises introducing an ammonia gas which is preheated to a temperature not less than 700° C.

3. The method of claim 1 wherein the step of reacting the preheated ammonia gas with the layer of titanium comprises reacting the preheated ammonia gas with the layer of titanium for a period of time not greater than 2 minutes.

4. The method of claim 1 wherein the step of heating the substrate comprises heating the substrate to a temperature not less than 600° C.

5. A method for forming a nitride film, comprising the steps of:
   providing a substrate having an overlying layer of material selected from the group consisting of titanium, hafnium, zirconium, vanadium, niobium, and tantalum formed thereon;
   placing the substrate in a reaction chamber;
   heating the substrate in the reaction chamber to a specified temperature;
   introducing an ammonia gas which is preheated to a temperature not less than 600° C. into the reaction chamber; and
   reacting the preheated ammonia gas with the layer of material to form a nitride.

6. The method of claim 5 wherein the step of introducing an ammonia gas comprises introducing an ammonia gas which is preheated to a temperature not less than 700° C.

7. The method of claim 5 wherein the step of heating the substrate comprises heating the substrate to a temperature not less than 600° C.

8. A method for fabricating a semiconductor device having a titanium nitride barrier layer using preheated ammonia, comprising the steps of:
   providing a silicon wafer;
   depositing a layer of titanium overlying the silicon wafer;
   heating the silicon wafer and the overlying layer of titanium to a temperature in excess of 600° C. in a reaction chamber;
   heating an ammonia gas in a vessel separate from the reaction chamber to a temperature greater than 700° C.;
   introducing the heated ammonia gas into the reaction chamber;
   reacting the heated ammonia gas and the overlying layer of titanium on the silicon wafer for a period of time not greater than two minutes to form a layer of titanium nitride on the overlying layer of titanium; and depositing a layer of material selected from the group consisting of aluminum and an aluminum alloy over the layer of titanium nitride.

9. The method of claim 8 wherein the step of depositing a layer of material selected from the group consisting of aluminum and an aluminum alloy comprises depositing a layer of material selected from the group consisting of aluminum and an aluminum alloy over, and at least partially in contact with, the layer of titanium nitride.

* * * * *